US010859647B2

United States Patent
Yang et al.

(10) Patent No.: US 10,859,647 B2
(45) Date of Patent: Dec. 8, 2020

(54) MAGNETIC RESONANCE IMAGING (MRI) TRANSMIT (TX)/ RECEIVE (RX) COIL USING THE SAME ARRAY COIL

(71) Applicant: Quality Electrodynamics, LLC, Mayfield Village, OH (US)

(72) Inventors: Xiaoyu Yang, Indiana, PA (US); Haoqin Zhu, Mayfield Village, OH (US); Tsinghua Zheng, Chesterland, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 0 days.

(21) Appl. No.: 16/278,763

(22) Filed: Feb. 19, 2019

(65) Prior Publication Data

US 2019/0257898 A1 Aug. 22, 2019

Related U.S. Application Data

(60) Provisional application No. 62/632,278, filed on Feb. 19, 2018.

(51) Int. Cl.
*G01V 3/00* (2006.01)
*G01R 33/36* (2006.01)
*G01R 33/34* (2006.01)

(52) U.S. Cl.
CPC ... *G01R 33/3664* (2013.01); *G01R 33/34076* (2013.01); *G01R 33/3614* (2013.01); *G01R 33/3628* (2013.01); *G01R 33/3642* (2013.01); *G01R 33/3678* (2013.01)

(58) Field of Classification Search
USPC .......................................................... 324/318
See application file for complete search history.

(56) References Cited

U.S. PATENT DOCUMENTS

| | | | |
|---|---|---|---|
| 4,680,549 A | 7/1987 | Tanttu | |
| 4,987,370 A | 1/1991 | Leussler et al. | |
| 2018/0081005 A1 | 3/2018 | Yang et al. | |
| 2018/0275226 A1* | 9/2018 | Yang | G01R 33/288 |
| 2018/0313918 A1* | 11/2018 | Yang | G01R 33/3628 |
| 2018/0321339 A1* | 11/2018 | Yang | G01R 33/3657 |

OTHER PUBLICATIONS

Wang et al. "Inductive Coupled Local TX Coil Design." Proceedings of the ISMRM Joint Annual Meeting, Stockholm Sweden, published May 1, 2010.

\* cited by examiner

*Primary Examiner* — Rodney E Fuller
(74) *Attorney, Agent, or Firm* — Eschweiler & Potashnik, LLC

(57) ABSTRACT

An example magnetic resonance imaging (MRI) radio frequency (RF) coil array comprises: at least one row of RF coil elements arranged radially around a cylindrical axis, wherein each row comprises: at least four RF coil elements circumferentially enclosing the cylindrical axis, wherein each RF coil element of that row is configured to operate in a Tx mode and in a Rx mode, wherein, in the Rx mode, each RF coil element of that row is tuned to a working frequency of the MRI RF coil array, and wherein, in the Tx mode, each RF coil element of that row is tuned to an additional frequency that is different than the working frequency, wherein the additional frequency is such that, a mode frequency of a selected mode resulting from coupling among the RF coil elements of that row is at the working frequency.

20 Claims, 11 Drawing Sheets

MAGNETIC RESONANCE IMAGING (MRI) TRANSMIT (TX)/ RECEIVE (RX) COIL USING THE SAME ARRAY COIL

REFERENCE TO RELATED APPLICATIONS

This application claims the benefit of U.S. Provisional Patent Applications No. 62/632,278 filed Feb. 19, 2018, entitled "MAGNETIC RESONANCE IMAGING (MRI) TRANSMIT (TX)/RECEIVE (RX) COIL", the contents of which are herein incorporated by reference in their entirety.

BACKGROUND

Magnetic resonance imaging (MRI) involves the transmission and receipt of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission (pTx) techniques.

RF coils create the $B_1$ field that rotates the net magnetization in a pulse sequence. RF coils may also detect precessing transverse magnetization. Thus, RF coils may be transmit (Tx) coils, receive (Rx) coils, or transmit and receive (Tx/Rx) coils. An imaging coil should be able to resonate at a selected Larmor frequency. Imaging coils include inductive elements and capacitive elements. The inductive elements and capacitive elements have been implemented according to existing approaches using two terminal passive components (e.g., capacitors). The resonant frequency, f, of an RF coil is determined by the inductance (L) and capacitance (C) of the inductor capacitor circuit according to equation (1):

$$f = \frac{1}{2\pi\sqrt{LC}} \quad (1)$$

Imaging coils may need to be tuned. Tuning an imaging coil may include varying the value of a capacitor. Recall that frequency: $f=\omega/(2\pi)$, wavelength in vacuum: $\Delta=c/f$, and $\lambda=4.7$ m at 1.5 T. Recall also that the Larmor frequency: $f_0=\gamma B_0/(2\pi)$, where (for $^1$H nuclei) $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

DETAILED DESCRIPTION

Figure 1:
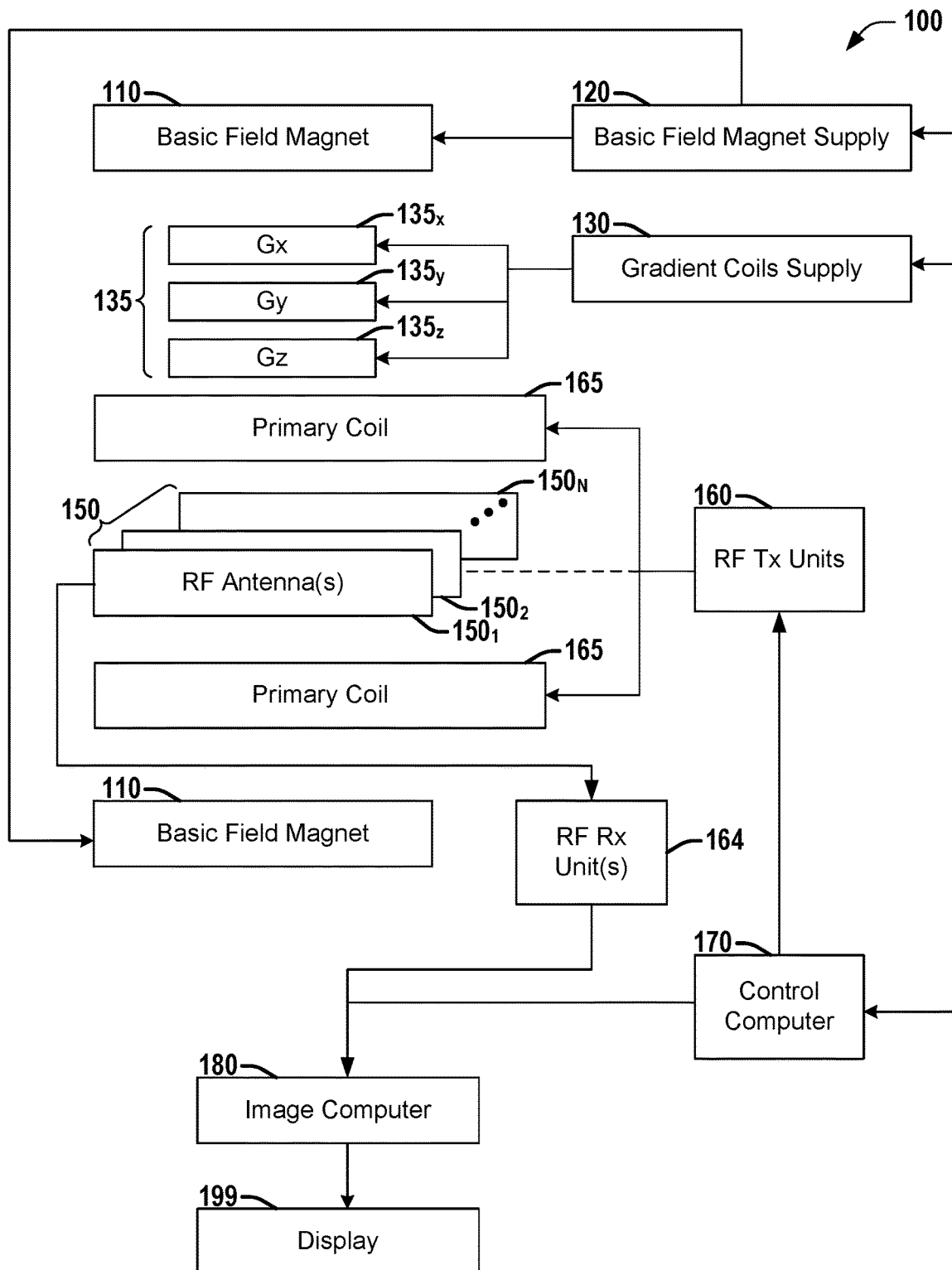
FIG. 1 is a block diagram illustrating an example MRI apparatus that can be configured with example MRI RF coils, coil elements, coil arrays, or circuitry according to one or more embodiments described herein.

The present disclosure will now be described with reference to the attached drawing figures, wherein like reference numerals are used to refer to like elements throughout, and wherein the illustrated structures and devices are not necessarily drawn to scale.

Embodiments described herein can be implemented in a MRI (Magnetic Resonance Imaging) system using any suitably configured hardware and/or software. Referring to FIG. 1, illustrated is an example MRI apparatus 100 that can be configured with example MRI RF coils, coil elements, coil arrays, or circuitry according to one or more embodiments described herein. Apparatus 100 includes basic field magnet(s) 110 and a basic field magnet supply 120. Ideally, the basic field magnets 110 would produce a uniform $B_0$ field. However, in practice, the $B_0$ field may not be uniform, and may vary over an object being imaged by the MRI apparatus 100. MRI apparatus 100 can include gradient coils 135 configured to emit gradient magnetic fields like $G_x$ (e.g., via an associated gradient coil $135_x$), $G_y$ (e.g., via an associated gradient coil $135_y$) and $G_z$ (e.g., via an associated gradient coil $135_z$). The gradient coils 135 can be controlled, at least in part, by a gradient coils supply 130. In some examples, the timing, strength, and orientation of the gradient magnetic fields can be controlled, and thus selectively adapted during an MRI procedure.

MRI apparatus 100 can include a primary coil 165 configured to generate RF pulses. The primary coil 165 can be a whole body coil. The primary coil 165 can be, for example, a birdcage coil. The primary coil 165 can be controlled, at least in part, by an RF transmission unit 160. RF transmission unit 160 can provide a signal to primary coil 165.

MRI apparatus 100 can include a set of RF antennas 150 (e.g., one or more RF antennas $150_1$-$150_N$, which can be as described herein). RF antennas 150 can be configured to generate RF pulses and to receive resulting magnetic resonance signals from an object to which the RF pulses are directed. In some embodiments, RF antennas 150 can be configured to inductively couple with primary coil 165 and generate RF pulses and to receive resulting magnetic resonance signals from an object to which the RF pulses are directed. In other embodiments, RF antennas 150 can be electrically coupled to a power source (e.g., RF Tx unit 160)

that can drive RF antennas 150 to generate RF pulses, and RF antennas can also be configured to receive resulting magnetic resonance signals from an object to which the RF pulses are directed. In one embodiment, one or more members of the set of RF antennas 150 can be fabricated from flexible coaxial cable, or other conductive material. The set of RF antennas 150 can be connected with an RF receive unit 164.

The gradient coils supply 130 and the RF transmission units 160 can be controlled, at least in part, by a control computer 170. The magnetic resonance signals received from the set of RF antennas 150 can be employed to generate an image, and thus can be subject to a transformation process like a two dimensional fast Fourier transform (FFT) that generates pixilated image data. The transformation can be performed by an image computer 180 or other similar processing device. The image data can then be shown on a display 199. RF Rx Units 164 can be connected with control computer 170 or image computer 180. While FIG. 1 illustrates an example MRI apparatus 100 that includes various components connected in various ways, it is to be appreciated that other MRI apparatus can include other components connected in other ways, and can be employed in connection with various embodiments discussed herein.

In one embodiment, MRI apparatus 100 includes control computer 170. In one example, a member of the set of RF antennas 150 can be individually controllable by the control computer 170. A member of the set of RF antennas 150 can be an example MRI RF coil array including, for example, MRI RF coil arrays as described herein. In various embodiments, the set of RF antennas 150 can include various combinations of example embodiments of MRI RF coil arrays, elements or example embodiments of MRF RF coil arrays, including single-layer MRI RF coil elements or single-layer MRI RF coil arrays, according to various embodiments described herein.

An MRI apparatus can include, among other components, a controller (e.g., control computer 170) and an RF coil (e.g., primary coil 165) operably connected to the controller. The controller can provide the RF coil with a current, a voltage, or a control signal. The coil can be a whole body coil. The coil can inductively couple with an example MRI RF coil element, or MRI RF coil array, as described herein. Control computer 170 can provide a DC bias current, or control a DC bias control circuit to control the application of a DC bias current to MRI RF coil arrays or elements that can be part of antennas 150.

A working MRI system requires two kinds of MRI coils. The first kind is a transmit (Tx) coil. The function of a Tx coil is to transmit high power RF energy into human anatomy to excite nuclei spins during a transmit mode. The second kind of coil is a receive (Rx) coil. The function of a Rx coil is to detect the weak signal from nuclei spins of human anatomy in a receive mode. Most MRI systems have a built-in whole body coil (WBC) as a Tx coil. One of the main disadvantages of such a design is that the WBC will apply RF energy to the entire human body, including portions which are not being scanned, in the common scenarios wherein the scan is only on one specific part of the anatomy. As an example, when a head scan is performed and a WBC is used as the Tx coil, not only does the head receive high levels of RF energy, but the shoulder and chest do as well. This creates a higher level specific absorption rate (SAR) issue.

As a result, another kind of Tx coil, a local Tx coil, is often used to mitigate this SAR issue. A local Tx coil is designed to only apply RF energy into the anatomy being scanned. There are several techniques for transferring energy from a power source to a local Tx coil. A first technique is via a direct connection using wires. This first technique is energy efficient and the energy loss in wires is trivial, but requires a dedicated wiring and a dedicated local Tx coil. A second technique to provide energy to a local Tx coil is to use inductive coupling. For this technique, a primary coil can be used that directly connects to a power source. The primary coil can be the WBC or another large coil that is a resonant LC circuit. The second (local) coil is another resonant circuit that is inductively coupled to the primary coil. As a result, energy can be transferred from the primary coil to the second coil. The second coil can be used to excite nearby anatomy more efficiently due to its smaller size and closer proximity to that anatomy. Compared to the first technique, the inductive coupling approach is less efficient than direct wiring, but still significantly more efficient than employing just a WBC as a Tx coil. The main advantage of the second technique is that no wiring is required. One example existing system employing the second technique introduced a special configuration to realize an inductively coupled knee coil. In this configuration, the knee coil has two layers. The first (inner) layer is a plural of receiving coil elements which detect signals from anatomy in receive mode and are decoupled in transmit mode. The second (outer) layer is a standard birdcage coil which inductively couples to the WBC to create a local amplified transmitting field in Tx mode and is decoupled in Rx mode. A third technique, developed by the present inventors and described in co-pending U.S. patent application Ser. No. 15/583,345 (the entirety of which is hereby incorporated by reference), is to employ an inductive coupling approach using the single layer coil, wherein the same coil array functions as both the Rx coil array and Tx coil array.

Various embodiments described herein employ a direct connection technique using a single layer coil according to aspects discussed herein, wherein the same Rx coil array is employed as a Tx coil in a Tx mode. In Rx mode, the primary coil is disabled, and the single layer coil functions as a typical Rx coil array at the working frequency. In Tx mode, switches (e.g., PIN diodes) can be used (e.g., opened or closed, depending on the specific circuit configuration) such that one or more coil elements are directly connected to the power source (either with or without phase shift, which can vary based on the coil element), such that each coil element of the array resonates at a predetermined frequency, which can be different from the working frequency. Each coil element of the coil array of various embodiments inductively couples to most others (e.g., non-adjacent coil elements) with mutual inductance. As a result, the predetermined frequency will split into multiple frequencies (modes) due to the mutual inductances. One of the multiple modes is the desired mode, e.g., a uniform mode for a cylindrical former. If the pre-determined frequency is chosen in such a way that the desired mode frequency is the same as the working frequency, then the desired mode can be driven in Tx mode as a Tx coil. The same approach can also be applied to embodiments comprising multiple-row configurations, as described in greater detail below. Compared to existing techniques, various embodiments discussed herein are simple to implement and provide improved efficiency.

Figure 2:
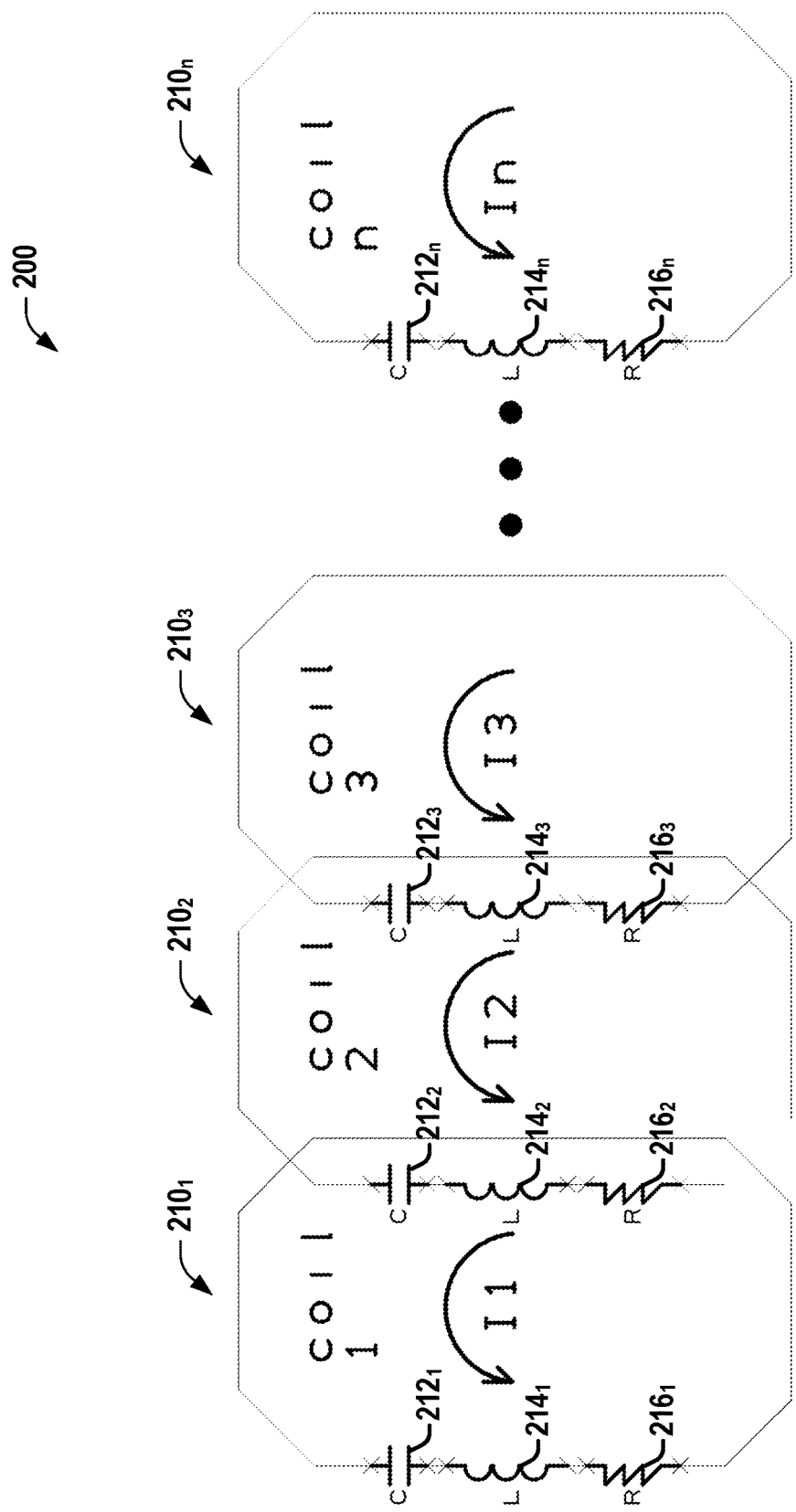
FIG. 2 is a diagram illustrating an example coil array comprising n identical coil elements around a cylindrical former, according to various aspects discussed herein.

Referring to FIG. 2, illustrated is a diagram of an example coil array 200 comprising n identical coil elements $210_i$ around a cylindrical former employable as a RF antenna in a MRI apparatus (e.g., as a RF antenna $150_i$ in MRI apparatus 100), according to various aspects discussed herein. In the example of FIG. 2, each loop is the same as the other loops, with the same values for equivalent capacitance from one or more capacitors $212_i$, equivalent inductance from one or more inductive elements (e.g., the wiring of the loop, etc.) $214_i$, and resistance from one or more resistive losses $216_i$ (e.g., coil loss, patient loss, radiation loss, etc.). In coil array 200 and various embodiments discussed herein, directly neighboring loops $210_i$ are overlapped such that the mutual inductances between them are very small. In Rx mode, all couplings with other neighboring coil elements $210_i$ are minimized using low input impedance preamplifiers (not shown in FIG. 2). In Tx mode, all coil elements 210 are resonant with high coil Q. In Tx mode, the coil elements $210_i$ will strongly couple to each other, with the exception of coupling between directly neighboring coil elements $210_i$.

For each coil element $210_i$, using Kirchhoff's Law, equations (1) can be determined:

$$\begin{cases} I_1 * Z + 0 + j\omega M_{13}I_3 + \ldots + j\omega M_{1n}I_n = 0 \\ 0 + I_2 * Z + 0 + j\omega M_{24}I_4 \ldots + j\omega M_{2n}I_n = 0 \\ \ldots \\ j\omega M_{n1}I_1 + j\omega M_{n2}I_2 + \ldots + 0 + I_n * Z = 0 \end{cases} \quad (1)$$

Due to cylindrical symmetry and the periodic condition requirement $I_j = I_{j+n}$, the solution to equations (1) can be written as in equation (2):

$$I_{j\_m} = \begin{cases} \cos\left(\dfrac{2\pi * m * j}{n}\right) & m = 0, 1, 2, \ldots, N/2 \\ \sin\left(\dfrac{2\pi * m * j}{n}\right) & m = 0, 1, 2, \ldots, \dfrac{N}{2} - 1 \end{cases} \quad (2)$$

Each value of m in equation (2) represents one coil resonant mode. Each mode can be considered as a combined resonant coil. The mode m=1 is the current distribution for uniform $B_1$ field or uniform mode. If this uniform mode frequency is chosen to be the same as the working frequency, the uniform mode can be employed for the Tx coil in Tx mode.

Figure 3:
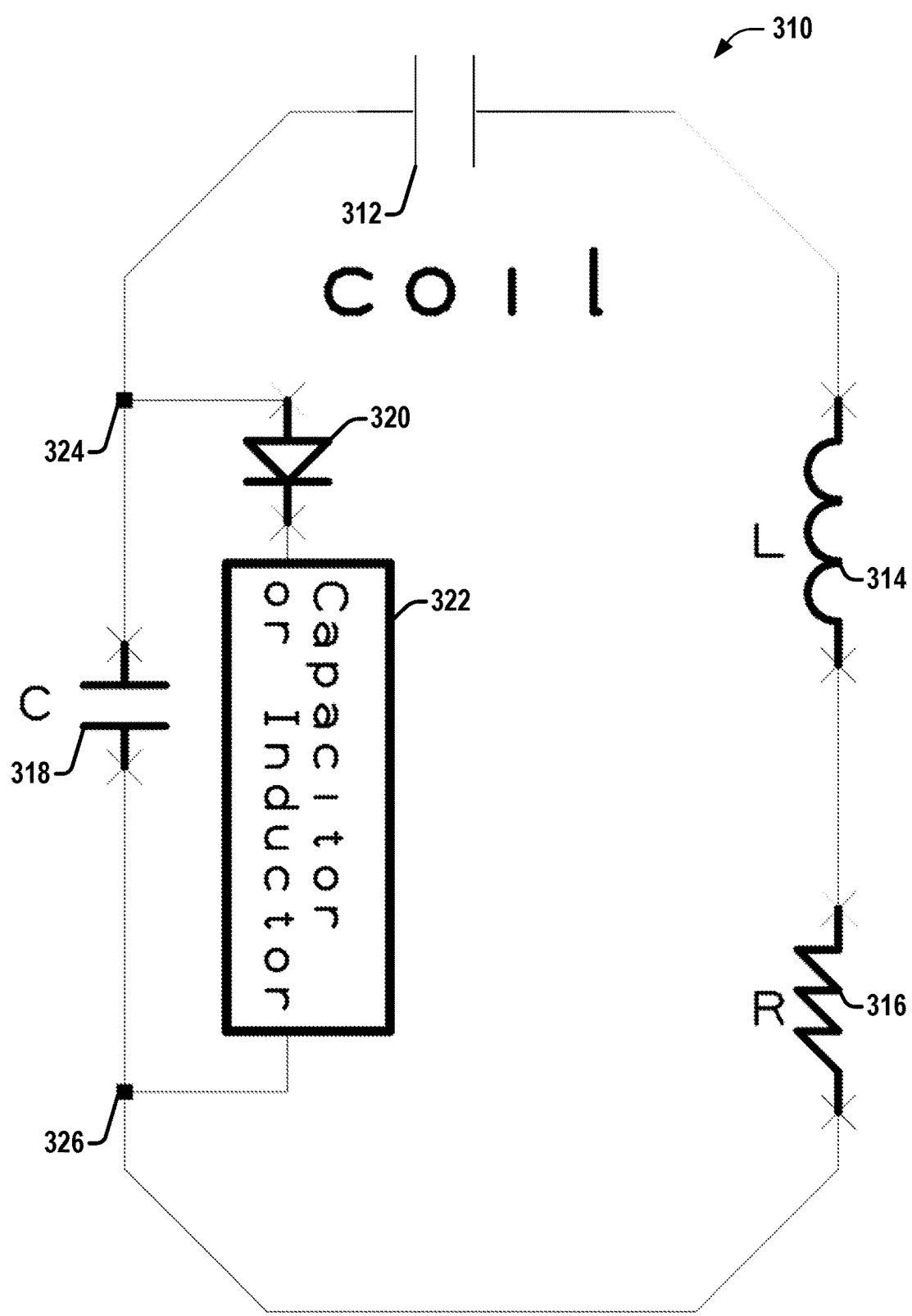
FIG. 3 is a diagram illustrating an example coil element that can be employed in a Transmit (Tx)/Receive (Rx) coil array, according to various aspects discussed herein.

Referring to FIG. 3, illustrated is a diagram of an example coil element 320 that can be employed in a Tx/Rx coil array employable as a RF antenna in a MRI apparatus (e.g., as a RF antenna $150_i$ in MRI apparatus 100), according to various aspects discussed herein. In Rx mode, PIN diode 320 is OFF (open), and the coil element 310 resonates at the working frequency. Low input impedance preamplifiers are used to decouple elements from each other (although embodiments shown herein illustrate a PIN diode 320 and capacitor/inductor 322 in parallel with first matching capacitor 318 between a first node 324 and a second node 326, other RF switch (e.g., FET, hybrid, etc.) arrangements can also be employed). Coil element 310 can also, like coil elements $210_i$, comprise one or more optional capacitors 312 (similar to capacitors $212_i$) that are not between nodes 324 and 326, one or more inductors 314 (similar to inductors $214_i$), and one or more resistors (or other resistive losses) 316 (similar to resistors $216_i$). In FIG. 3, the preamplifier circuit (e.g., which can have inputs connected to nodes 324 and 326, either directly or via one or more intervening circuit elements) is not shown here for simplicity. In Tx mode, the PIN diode 320 is ON (short), the preamplifier is not used and the coil element is high Q resonant circuit.

Because of the mutual inductance among coil elements, most coil elements (e.g., except directly neighboring elements) will couple to each other. Therefore, the resonant frequency will split into multiple frequencies. The value of capacitor/inductor value can be chosen in such a way that the uniform mode frequency is same as the working frequency. If each coil element resonates at the same frequency in Tx mode, the mutual coupling can be maximized.

Figure 4:
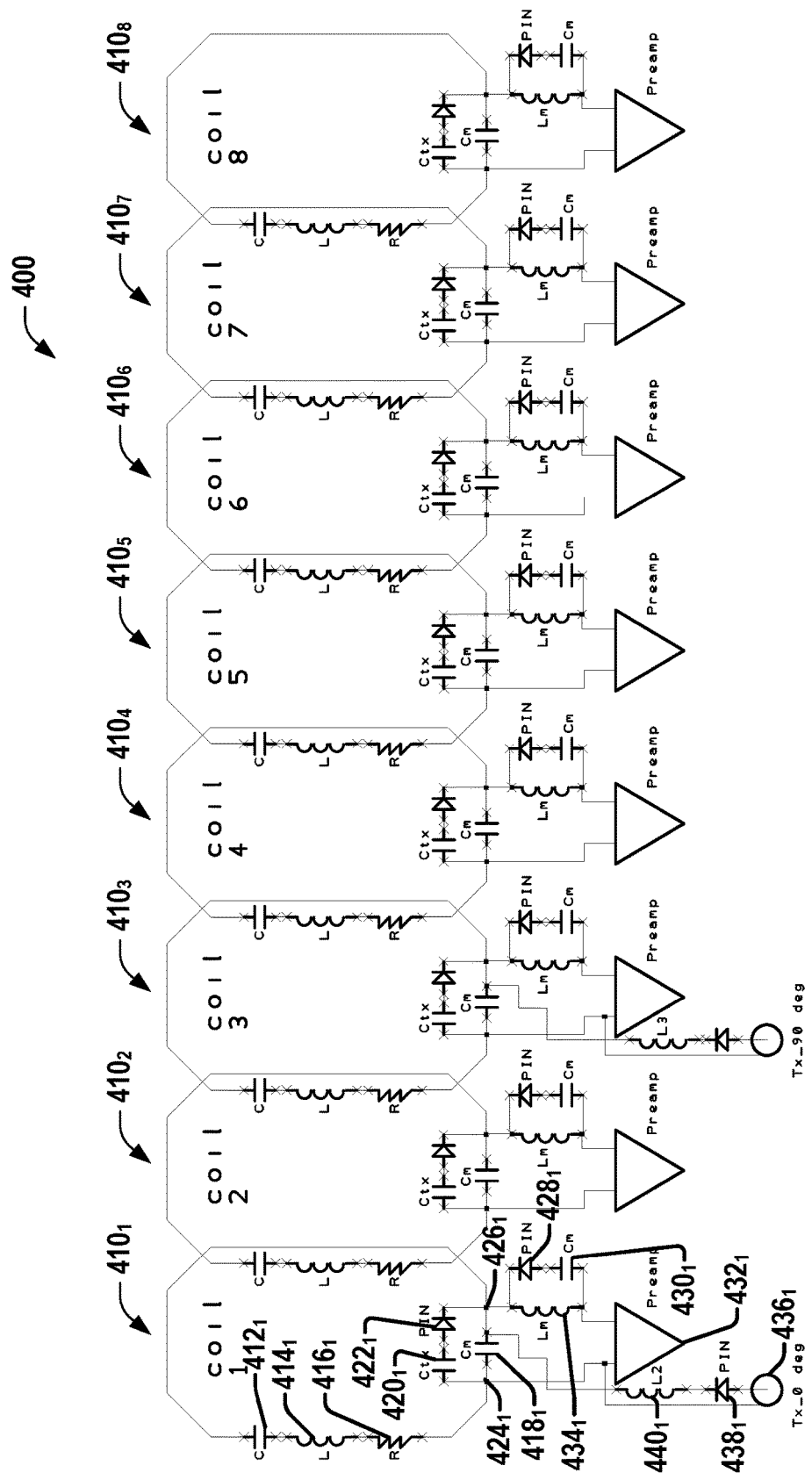
FIG. 4 is a diagram illustrating a first example eight-loop coil array configured as a Tx/Rx coil that can be employed as a RF antenna in a MRI apparatus, according to various aspects discussed herein.

Referring to FIG. 4, illustrated is a diagram of a first example eight-loop coil array 400 configured as a Tx/Rx coil that can be employed as a RF antenna in a MRI apparatus (e.g., as a RF antenna $150_i$ in MRI apparatus 100), according to various aspects discussed herein. For clarity of illustration, individual circuit elements are only labeled in connection with coil element $410_1$, although coil elements $410_2$-$410_8$ have equivalent circuit elements (with the exception of elements $436_i$, $440_i$, which are only in coils $410_1$ and $410_3$ in the example embodiment shown; however, in various embodiments, any coil element $410_i$ can comprise optional circuit elements $436_i$-$440_i$). Circuit elements and nodes $412_i$-$426_i$ are equivalent to circuit elements and nodes 312-326. In FIGS. 4, $412_i$, $414_i$, and $416_i$ represent the equivalent capacitance, inductance, and resistance, respectively of the portion of the loop of $410_i$ that is not between nodes $424_i$ and $426_i$.

A first end of first matching capacitor $418_i$ is connected to first node $424_i$, and a second end of first matching capacitor $418_i$ is connected to second node $426_i$ (with this and other arrangements of circuit elements discussed herein, connections can be direct as illustrated in the figures, or can be via one or more additional circuit elements that do not alter the operation of elements as discussed herein). A first end of Tx capacitor $420_i$ is connected to first node $424_i$ and a second end of Tx capacitor $420_i$ is connected to a first end (anode) of first PIN diode $422_i$, while the second end (cathode) of first PIN diode $422_i$ is connected to second node $426_i$. A second end (cathode) of second PIN diode $428_i$ is connected to second node $426_i$, and a first end (anode) of second PIN diode $428_i$ is connected to a first end of second matching capacitor $430_i$, while the second end of second matching capacitor $430_i$ is connected to a second input of preamplifier $432_i$. A first end of a matching inductor $434_i$ is connected to second node $426_i$ and a second end of the matching inductor $434_i$ is connected to the second input of preamplifier $432_i$. A first input of preamplifier $432_i$ is connected to the first node $424_i$. In coil elements $410_i$ with direct connection to a Tx port $436_i$ (e.g., at least one coil element $410_i$ of the coil array 400, such as $410_1$ and $410_3$ in example embodiment 400), a first output of Tx port $436_i$ is connected to the first node $424_i$, while the second output of power Tx port $436_i$ is connected to a first end (anode) of third PIN diode $438_i$. The second end of third PIN diode $438_i$ is connected to a first end of a transmit inductor $440_i$, while the second end of the transmit inductor $440_i$ is connected to the second node $426_i$. Tx port $436_i$ can provide an RF Tx signal to coil $410_i$ with a phase appropriate for coil $410_i$, for example, in embodiments wherein more than one coil element $410_i$ has a direct connection. As a first example, for an embodiment with a single coil element with a direct connection, a 0° phase can be applied. As a second example, for 4N total coil elements, coil element $410_1$ can be driven at 0° phase and coil element $410_{N+1}$ can be driven at 90° phase, for an embodiment driven in quadrature (e.g., like example coil array 400).

Operation of coil elements $410_i$ of coil array 400 can be explained by considering coil element $410_1$.

In Rx mode all PIN diodes ($422_1$, $428_1$, and $438_1$) are OFF (open), and coil element $410_1$ resonates at the working frequency. Matching capacitors $418_1$ and $430_1$ and matching inductor $434_1$ will match coil element $410_1$ and feed the signal to preamplifier $432_1$.

In Tx mode, all PIN diodes ($422_1$, $428_1$, and $438_1$) are ON (short), matching capacitors $418_1$ and $430_1$ and matching inductor $434_1$ and second PIN diode $428_1$ will resonate and create high impedance that isolates preamplifier $432_1$ from coil element $410_1$, which will resonate at high Q. Tx capacitor $420_1$ near first matching capacitor $418_1$ becomes part of the coil because first PIN diode $422_1$ near it is short. Thus, coil element $410_1$ resonates at a different frequency from the working frequency. The value of Tx capacitor $420_1$ and the same capacitors at other $420_i$ can be chosen in such a way that the uniform mode frequency is the same as the working frequency. In Tx mode, transmit inductor $440_1$ is also enabled, because third PIN diode $438_1$ is ON. Transmit inductor $440_1$ will match coil element $410_1$ to Tx port $436_1$. Transmit power can be fed to coil element $410_1$ through Tx port $436_1$. For coil element $410_1$, the phase can be chosen to be 0°. Coil element $410_3$ can be operated similarly to coil element $410_1$, except that the feeding phase from Tx port $436_1$ can be 90°. The configuration shown as example coil array 400 allows a birdcage-like coil to be driven in quadrature in Tx mode, and to receive through each of the eight coil elements $410_i$ of the array 400 in Rx mode. As another possible embodiment, coil array 400 can also be driven at coil element $410_1$ with 0° phase, coil element $410_3$ with 90° phase, coil element $410_5$ with 180° phase, and coil element $410_7$ with 270° phase, which can provide for more uniform Tx power distribution. Furthermore, if the Larmor frequency is high and the wavelength inside anatomies is short, the driving phases can be deviated from by an integer multiple of 90°, and the driving magnitude can also be deviated from being equal to each other. This is for Tx uniformity optimization. Regardless of which coil element(s) $410_i$ are driven, various embodiments comprise a Tx/Rx coil using the same receiving array coil for one row without any additional layer of hardware structure, in contrast to existing systems.

For embodiments with a high channel count array coil on a cylindrical former, a single row is insufficient. In various aspects, embodiments can comprise coil arrays that have two or more rows. The directly neighboring coil elements (e.g., $410_i$, etc.) between adjacent rows can have overlap to ensure coupling is minimized for SNR (Signal-to-Noise Ratio) consideration. For such a configuration, the same technique applies as discussed in connection with the single row scenario. For each row, there is a uniform mode in the Tx mode, and that uniform mode can be (e.g., with appropriate choice of capacitor values, etc.) at the working frequency. Additionally, as noted above, the uniform mode can be considered as a combined coil and can be thought of as a coil or virtual coil. Between neighboring rows, the uniform mode of each row will couple to each other strongly, because the overlap between rows is only good for individual array element only, and not for the uniform modes of those neighboring rows. As a result, the uniform mode frequency of different rows will split into multiple frequencies (e.g., two frequencies in a two row embodiment). In a two row embodiment, one of the frequencies is for the two uniform modes flowing in the same direction, and the other one is for them flowing in opposite directions. The same direction flow is the new uniform mode for both rows. However, for specialized applications, the opposite directions flow mode can be very useful, for example, for interventional application with a metal wire catheter, the opposite directions flow mode can still generate acceptable imaging but with significantly less heat. Regardless, of the desired mode, the value of the transmit capacitor $420_i$ and the same capacitors at other coil elements can be selected in such a way that the desired new two-row mode frequency is at the working frequency. In such a manner, a birdcage-like mode can be obtained for a two-row configuration. The same technique can be applied for more than two rows. To drive more than a two-row coil in Tx mode, the coil can be driven in either one row or in multiple rows. The major consideration is whether the couplings between rows are strong enough, which can vary between embodiments. If the couplings are strong enough, then driving at one row will ensure the other rows are excited at the working frequency. If the couplings are not strong enough, different rows can be driven to ensure each row being excited.

Figure 5:
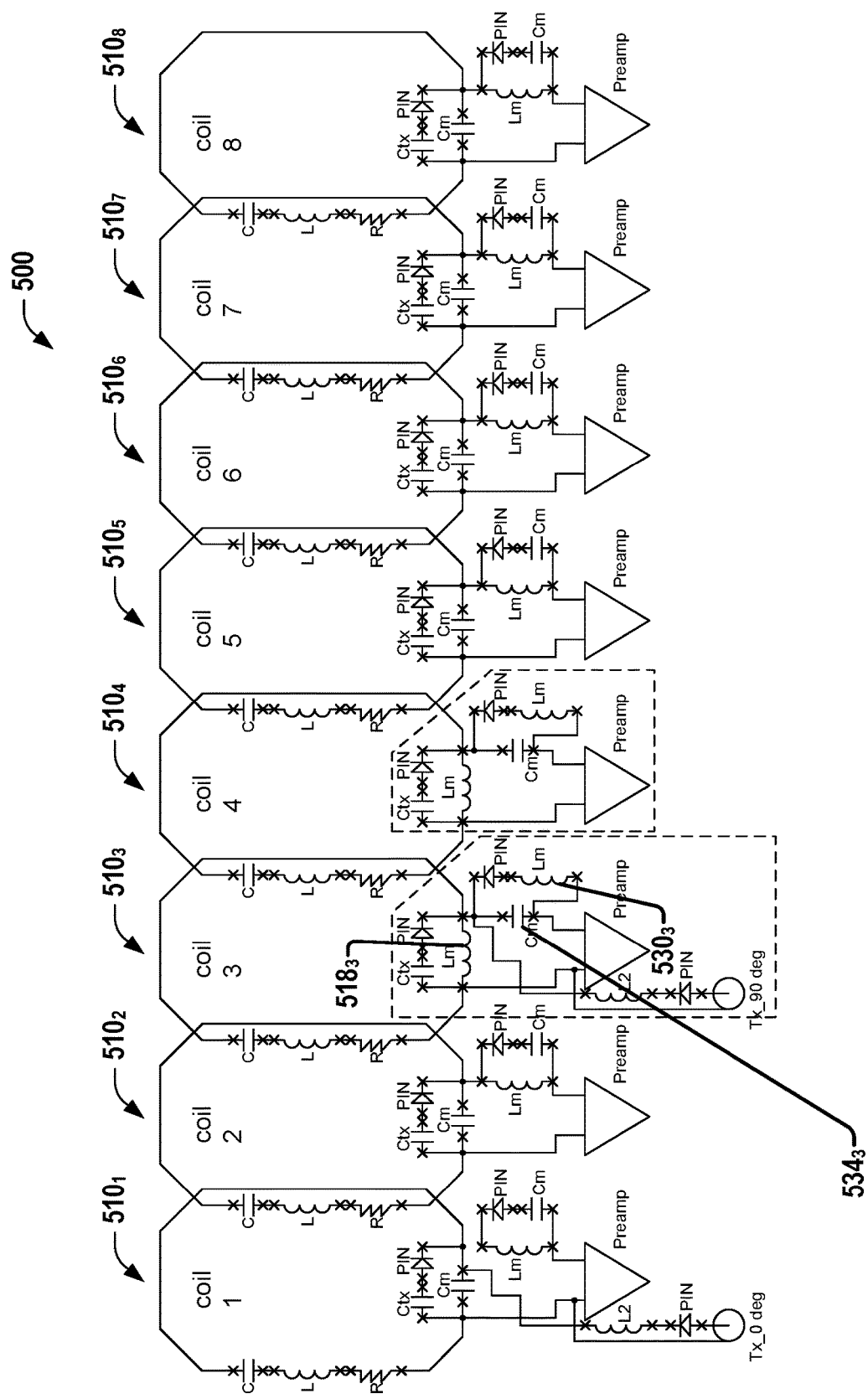
FIG. 5 is a diagram illustrating a second example eight-loop coil array configured as a Tx/Rx coil that can be employed as a RF antenna in a MRI apparatus, according to various aspects discussed herein.

Referring to FIG. 5, illustrated is a diagram of a second example eight-loop coil array 500 configured as a Tx/Rx coil that can be employed as a RF antenna in a MRI apparatus (e.g., as a RF antenna $150_i$ in MRI apparatus 100), according to various aspects discussed herein. Coil array 500 is similar to coil array 400, but coil elements $510_3$ and $510_4$ show a different potential arrangement of circuit elements. For ease of illustration, only the circuit elements that differ from those of coil array 400 are labeled, and are only labeled on coil element $510_3$, with all other circuit elements and nodes in FIG. 5 having the same function(s), name, and numbering as corresponding elements in FIG. 4. Coil element $510_4$ has the same arrangement of circuit elements as coil element $510_3$, with the exception of the optional elements $436_i$-$440_i$, which provide for driving the coil element $510_3$. In coil elements $510_3$ and $510_4$, first matching capacitor $418_i$, second matching capacitor $430_i$, and matching inductor $434_i$ are not included. In their place, coil element $510_3$ comprises a first matching inductor $518_3$ with a first end connected to the first node $424_3$ and a second end connected to the second node $426_3$, second inductor $530_3$ with a first end connected to the first end (anode) of second PIN diode $428_3$ and a second end connected to the second input of preamplifier $432_3$, and matching capacitor $534_3$ has a first end connected to second node $426_3$ and a second end connected to the second input of preamplifier $432_3$. In coil element $510_3$, second inductor $530_3$ can resonate with matching capacitor $534_3$ to create high impedance in Tx mode, while in Rx mode, $534_3$ can act as a matching capacitor, such that coil element $510_3$ has the roles of inductors and capacitors exchanged from coil element $410_1$, discussed above.

Figure 6:
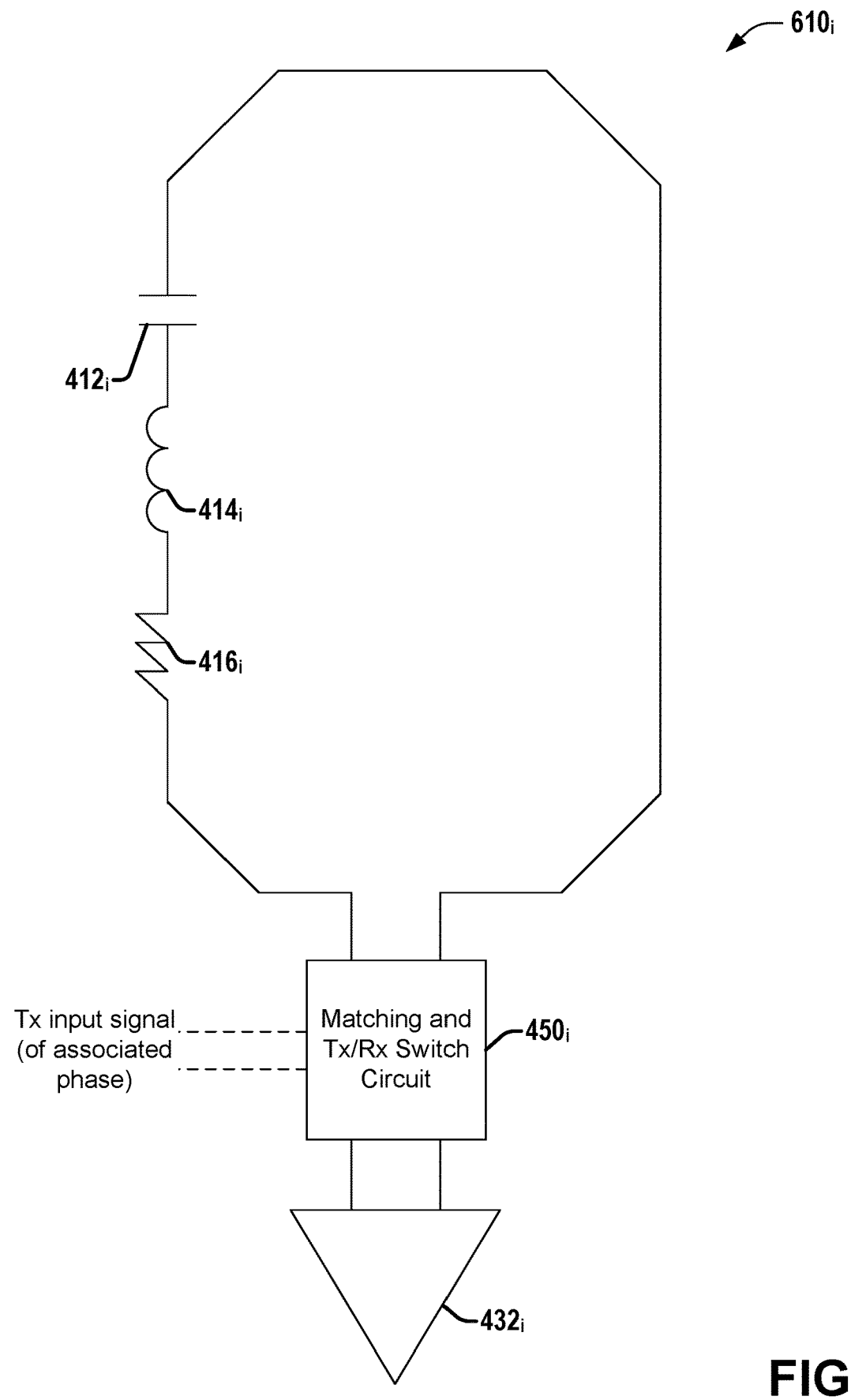
FIG. 6 is a diagram illustrating a first example coil element employable in a MRI RF coil array, according to various aspects discussed herein.

Referring to FIG. 6, illustrated is a diagram of a first example coil element $610_i$ that corresponds to a coil element of FIG. 4 or FIG. 5, according to various aspects discussed herein. Coil element $610_i$ comprises circuit elements and nodes $412_i$-$416_i$, $418_i$ or $618_i$, $420_i$-$428_i$, $430_i$ or $630_i$, $432_i$, $434_i$ or $634_i$, and optional circuit elements $436_i$-$440_i$ ($436_i$-$440_i$ optional circuit elements can be included in coil element(s) to provide a direct connection to a power source), with each of these elements other than preamplifier $432_i$ grouped as a matching and Tx/Rx switch circuit $450_i$.

Figure 7:
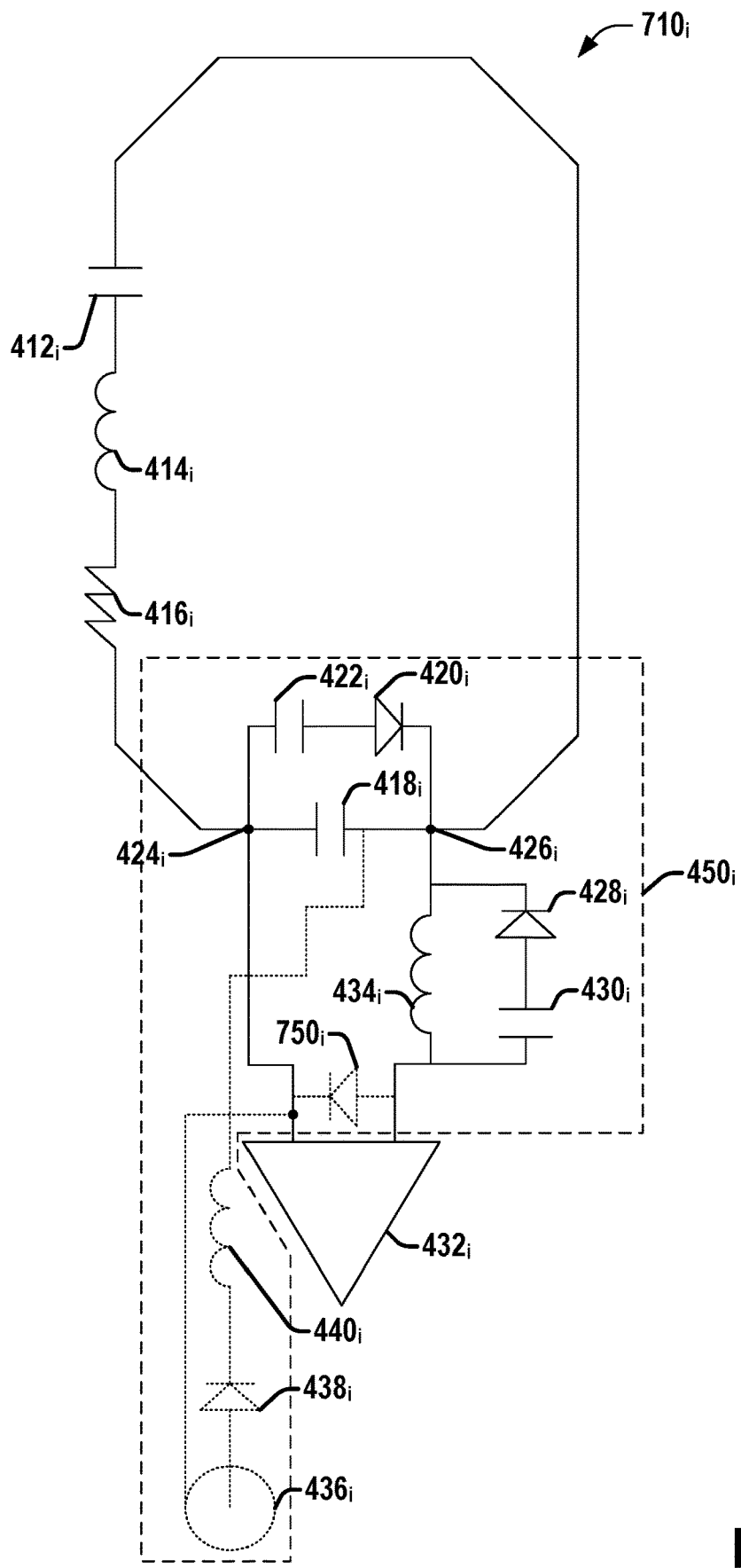
FIG. 7 is a diagram illustrating a second example coil element employable in a MRI RF coil array, according to various aspects discussed herein.

Matching and Tx/Rx switch circuit $450_i$, when operating in Tx mode, electrically isolates coil element $610_i$ from preamplifier $432_i$ upon coil elements $610_i$ resonating with one another such that a selected mode frequency of the coil elements $610_i$ is at a working frequency. Matching and Tx/Rx switch circuit $450_i$ electrically isolates coil element $610_i$ from preamplifier $432_i$ by providing a threshold level of impedance between coil element $610_i$ and preamplifier $432_i$. Additionally, for coil elements $410_i$ comprising optional circuit elements $436_i$-$440_i$, matching and Tx/Rx switch circuit $450_i$, when operating in Tx mode, electrically connects coil element $610_i$ to a Tx input signal via circuit elements $436_i$-$440_i$. Matching and Tx/Rx switch circuit $450_i$, when operating in Rx mode, electrically connects the coil element $610_i$ with the preamplifier $432_i$ by providing low impedance between the coil element $610_i$ and preamplifier $432_i$. Preamplifier $432_i$ can be a low input impedance low noise amplifier (LNA). In some embodiments, matching and Tx/Rx switch circuit $450_i$ can be a capacitive matching and Tx/Rx switch circuit, such as shown in FIG. 7, discussed below. In other embodiments, matching and Tx/Rx switch circuit $450_i$ can be an inductive matching and Tx/Rx switch circuit, as shown in FIG. 8, discussed below.

Referring to FIG. 7, illustrated is a diagram of a second example coil element $710_i$ that corresponds to a coil element $410_i$ of coil array 400, according to various aspects discussed herein. Coil element $710_i$ comprises circuit elements and nodes $412_i$-$440_i$ (with $436_i$-$440_i$ as optional circuit elements to include in coil element(s) to provide a direct connection to a power source), with elements $418_i$-$440_i$ grouped as one possible embodiment of a matching and Tx/Rx switch circuit $450_i$. Coil element $710_i$ can also include optional shunt PIN diode $750_i$, wherein a first end (anode) of shunt PIN diode $750_i$ can be connected to a second input of preamplifier $432_i$ and a second end (cathode) of shunt PIN diode $750_i$ can be connected to a first input of preamplifier $432_i$, and shunt PIN diode $750_i$ can provide additional shunt protection for preamplifier $432_i$. Matching and Tx/Rx switch circuit $450_i$ in coil element $710_i$ is an example embodiment of a capacitive matching and Tx/Rx switch circuit $450_i$.

Figure 8:
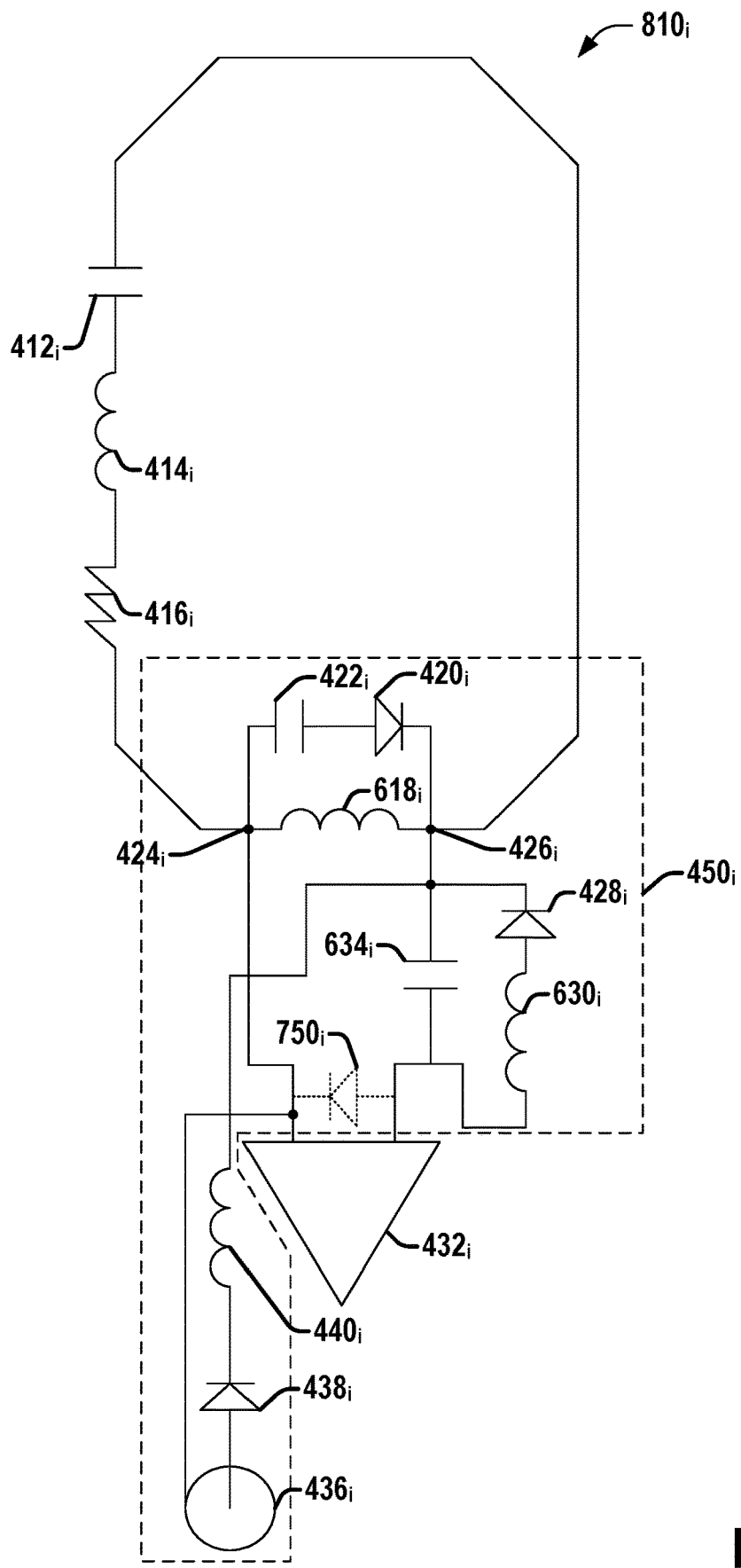
FIG. 8 is a diagram illustrating a third example coil element employable in a MRI RF coil array, according to various aspects discussed herein.

Referring to FIG. 8, illustrated is a diagram of a third example coil element $810_i$ that corresponds to inductively matched coil element $610_3$ or $610_4$ of coil array 600, according to various aspects discussed herein. Coil element $810_i$ comprises circuit elements and nodes $412_i$-$416_i$, $618_i$, $420_i$-$428_i$, $630_i$, $432_i$, $634_i$, and optional circuit elements $436_i$-$440_i$ ($436_i$-$440_i$ optional circuit elements can be included in coil element(s) to provide a direct connection to a power source), with elements $618_i$, $420_i$-$428_i$, $630_i$, $634_i$, and optional circuit elements $436_i$-$440_i$ grouped as one possible embodiment of a matching and Tx/Rx switch circuit $450_i$. Coil element $810_i$ can also include optional shunt PIN diode $750_i$, wherein a first end (anode) of shunt PIN diode $750_i$ can be connected to a second input of preamplifier $432_i$ and a second end (cathode) of shunt PIN diode $750_i$ can be connected to a first input of preamplifier $432_i$, and shunt PIN diode $750_i$ can provide additional shunt protection for preamplifier $432_i$. Matching and Tx/Rx switch circuit $450_i$ in coil element $810_i$ is an example embodiment of an inductive matching and Tx/Rx switch circuit $450_i$.

Figure 9:
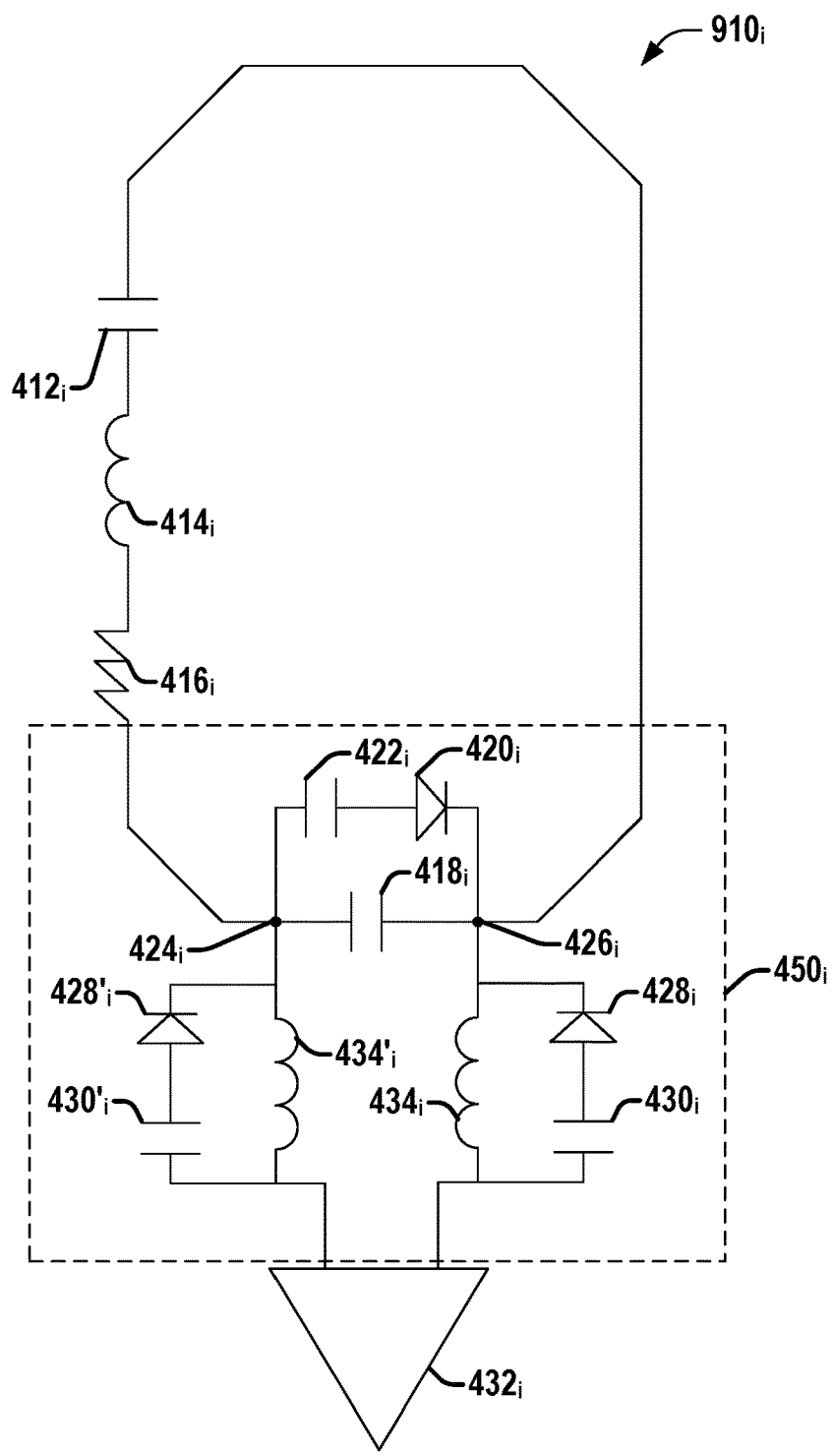
FIG. 9 is a diagram illustrating a fourth example coil element employable in a MRI RF coil array, according to various aspects discussed herein.

Referring to FIG. 9, illustrated is a diagram of a fourth example coil element $910_i$ employable as a coil element in a coil array, according to various aspects discussed herein. Coil element $910_i$ comprises circuit elements and nodes $412_i$-$440_i$ (with $436_i$-$440_i$ as optional circuit elements to include in coil element(s) to provide a direct connection to a power source), with elements $418_i$-$440_i$ grouped as one possible embodiment of a matching and Tx/Rx switch circuit $450_i$. Additionally, coil element $910_i$ comprises a fourth PIN diode $428'_i$, a third matching capacitor $430'_i$, and a second matching inductor $434'_i$. A first end (anode) of fourth PIN diode $428'_i$ is connected to a first end of third matching capacitor $430'_i$ and a second end (cathode) of fourth PIN diode $428'_i$ is connected to first node $424_i$. A second end of third matching capacitor $430'_i$ is connected to the first input of preamplifier $432_i$. A first end of second matching inductor $434'_i$ is connected to first node $424_i$ and a second end of second matching inductor $434'_i$ is connected to the first input of preamplifier $432_i$. Matching and Tx/Rx switch circuit $450_i$ in coil element $910_i$ is an example embodiment of a capacitive matching and Tx/Rx switch circuit $450_i$.

Figure 10:
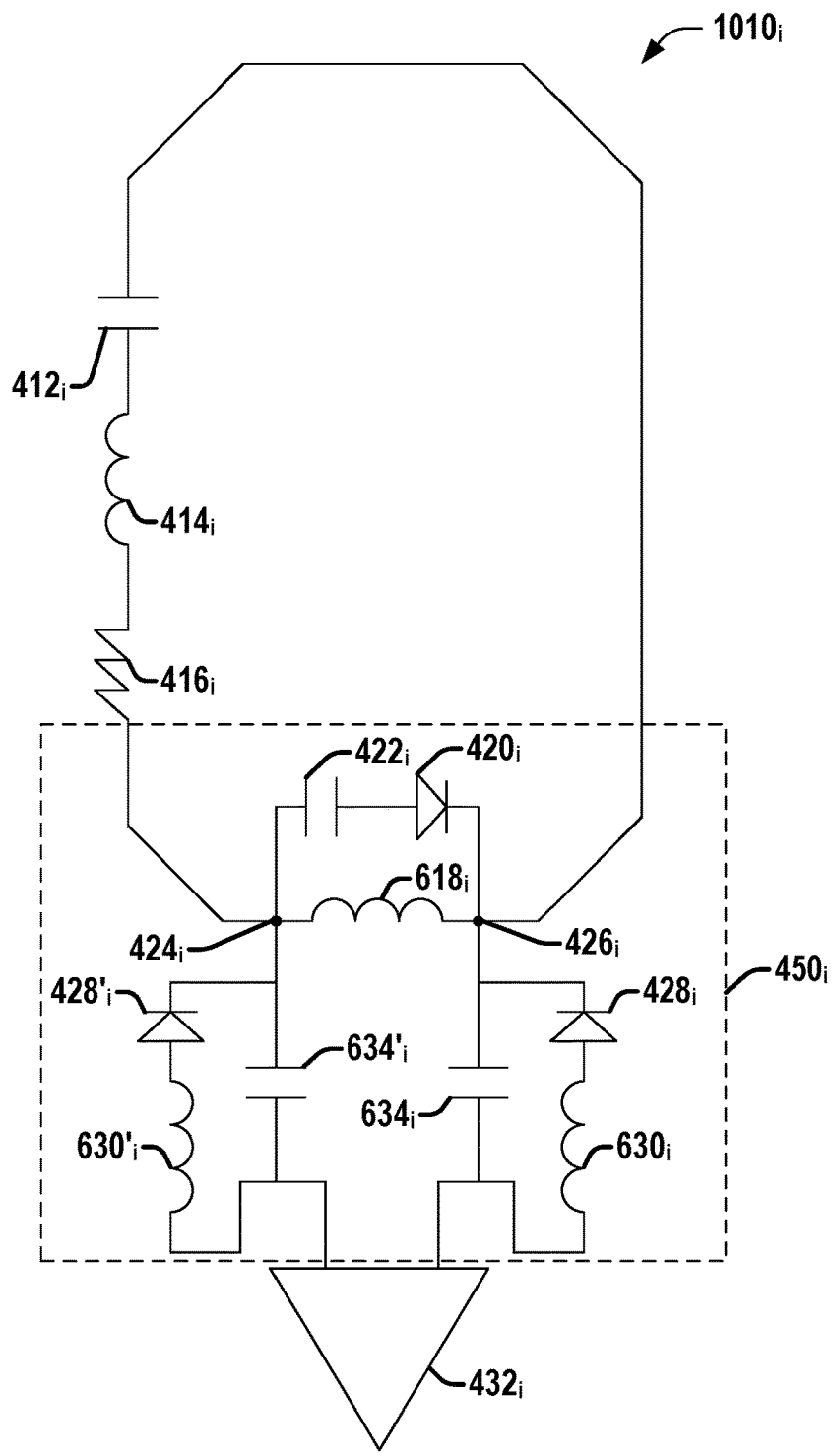
FIG. 10 is a diagram illustrating a fifth example coil element employable in a MRI RF coil array, according to various aspects discussed herein.

Referring to FIG. 10, illustrated is a diagram of a fifth example coil element $910_i$ employable as a coil element in a coil array, according to various aspects discussed herein. Coil element $1010_i$ comprises circuit elements and nodes $412_i$-$440_i$ (with $436_i$-$440_i$ as optional circuit elements to include in coil element(s) to provide a direct connection to a power source), with elements $618_i$, $420_i$-$428_i$, $630_i$, $634_i$, and optional circuit elements $436_i$-$440_i$ grouped as one possible embodiment of a matching and Tx/Rx switch circuit $450_i$. Additionally, coil element $1010_i$ comprises a fourth PIN diode $428'_i$, a third matching inductor $630'_i$, and a second matching capacitor $634'_i$. A first end (anode) of fourth PIN diode $428'_i$ is connected to a first end of third matching inductor $630'_i$ and a second end (cathode) of fourth PIN diode $428'_i$ is connected to first node $424_i$. A second end of third matching inductor $630'_i$ is connected to the first input of preamplifier $432_i$. A first end of second matching capacitor $634'_i$ is connected to first node $424_i$ and a second end of second matching capacitor $634'_i$ is connected to the first input of preamplifier $432_i$. Matching and Tx/Rx switch circuit $450_i$ in coil element $1010_i$ is an example embodiment of an inductive matching and Tx/Rx switch circuit $450_i$.

Figure 11:
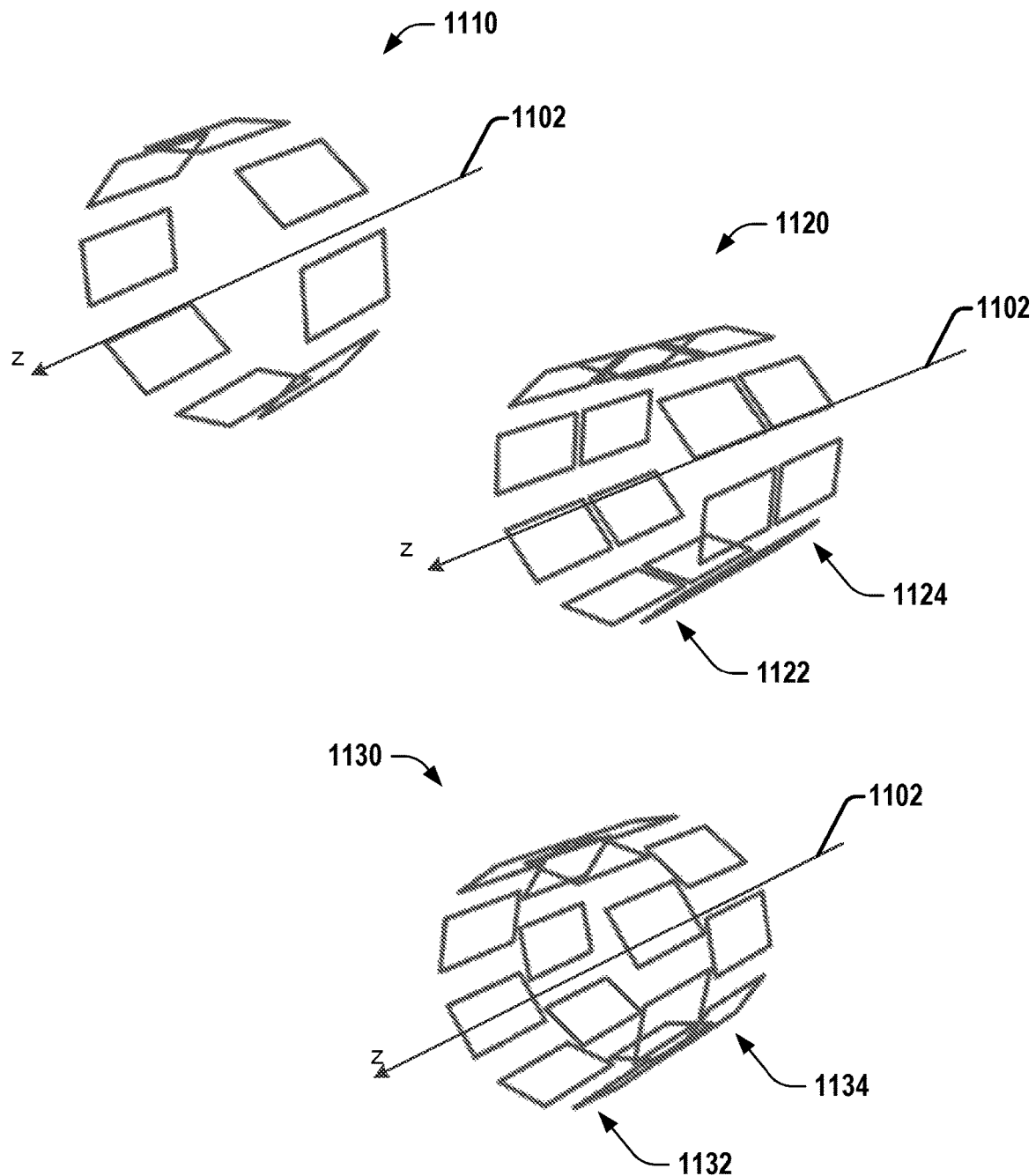
FIG. 11 is a diagram illustrating various example embodiments of directly connected single layer coil arrays that can be employed in various aspects discussed herein.

Referring to FIG. 11, illustrated is a diagram showing various example embodiments of directly connected single layer coil arrays (e.g., wherein each row of 1110, 1120, or 1130 can be a coil array such as coil arrays 200, 400, or 500 or other embodiments discussed herein) that can be employed in various aspects discussed herein. Directly connected single layer coil array 1110 is one example embodiment that comprises at least one MRI RF coil elements (although FIG. 5 shows eight coil elements, in various embodiments, four or more can be employed) arranged in a single-row configuration. Each of the at least one MRI RF coil elements can be a coil element such as coil elements $210_i$, $310_i$, $410_i$, $510_i$, $610_i$, $710_i$, $810_i$, $910_i$, or $1010_i$, and one or more of the at least one MRI RF coil elements can have a direct connection to a power supply via optional circuit elements $436_i$-$440_i$.

FIG. 11 also illustrates another example embodiment of a single-layer MRI RF coil array 1120 that includes at least two MRI RF coil elements arranged in a two-row configuration with each row comprising at least one MRI RF coil element. MRI RF coil array 1120 includes a first row 1122 longitudinally offset (e.g., and partially overlapping, or alternatively, with no overlap) from and rotationally (e.g., azimuthally) aligned with a second row 1124. In various embodiments, first row 1122 can comprise at least four RF coil elements (e.g., 4N RF coil elements, where N is a positive integer, or any other positive integer number of RF coil elements). In various embodiments, second row 1122 can comprise at least four RF coil elements (e.g., 4N RF coil elements, where N is a positive integer, or any other positive integer number of RF coil elements). FIG. 11 further illustrates an additional MRI RF coil array 1130. MRI coil array 1130 is similar to MRI RF coil array 1120, except the first row 1132 is not aligned with second row 1134. For example, first row 1132 may be rotated a number of degrees around a central axis 1102 (e.g., z axis) shared with second row 1134, while 1134 is not rotated, or is rotated a different number of degrees. In different embodiments, first row 1132 can be aligned to within a threshold level of alignment with second row 1134 (e.g., within a threshold distance or angle between nearest RF coil elements of the first row 1132 and second row 1134). In one embodiment, MRI RF coil array 1120 includes a first plurality of RF coil elements (e.g., first row 1122) and a second plurality of RF coil elements (e.g., second row 1124). The first plurality of RF coil elements and the second plurality of RF coil elements are radially disposed about a longitudinal axis 1102. The first plurality and the second plurality can be longitudinally offset a threshold distance greater than zero along the longitudinal axis 1102. In one embodiment, an element of the first plurality of RF coil elements is axially offset a threshold amount from a respective element of the second plurality of RF coil elements. For example, an element of the first plurality of RF coil elements can be axially offset 15 degrees, 30 degrees, or another, different number of degrees, from a respective element of the second plurality of RF coil elements. The first plurality and the second plurality can include the same number of RF coil elements, or can include different numbers of RF coil elements. For example, in one embodiment, the first plurality can include eight RF coil elements, while the second plurality can include seven RF coil elements. Other, different numbers of RF coil elements can be employed.

In another embodiment, the RF coil elements of the MRI RF coil array can be arranged in a three-row configuration, wherein each row can be as described herein (e.g., in connection with FIGS. 2-10). For example, a three-row single layer MRI RF coil array with direct connection can include a first row that includes at least four RF coil elements, a second row that includes at least four RF coil elements, and a third row that includes at least four RF coil elements (wherein the coil array can be driven via one row or more than one row). In this embodiment, the first row, second row, and third row can be aligned axially, two of them can be aligned axially with the third unaligned, or all three can be unaligned axially. In another embodiment, other different numbers of rows, number(s) of RF coil elements, or combinations of alignments can be employed.

For example, in one embodiment, MRI RF coil array 1120 includes a first plurality of RF coil elements 1122, a second plurality of RF coil elements 1124, and a third plurality of RF coil elements (not illustrated). In this embodiment, the first plurality of RF coil elements 1122, the second plurality of RF coil elements 1124, and the third plurality of RF coil elements are radially disposed about a longitudinal axis. The first plurality 1122, the second plurality 1124, and the third plurality are longitudinally offset a threshold amount along the longitudinal axis. In one embodiment, an element of the first plurality 1122 of RF coil elements is axially offset a threshold amount from a respective element of the second plurality 1124 of RF coil elements or the third plurality of RF coil elements. The first plurality 1122, the second plurality 1124, and the third plurality can include the same number of RF coil elements, or can include different numbers of RF coil elements. For example, in one embodiment, the first plurality 1122 can include eight RF coil elements, the second plurality 1124 can include six RF coil elements, and the third plurality can include seven RF coil elements. In another embodiment, the first plurality 1122, the second plurality 1124, or the third plurality can include other, different numbers of RF coil elements.

Examples herein can include subject matter such as a method, means for performing acts or blocks of the method, at least one machine-readable medium including executable instructions that, when performed by a machine (e.g., MRI machine, for example as described herein, etc.) cause the machine to perform acts of the method or of an apparatus or system according to embodiments and examples described.

A first example embodiment comprises a magnetic resonance imaging (MRI) radio frequency (RF) coil array on a cylindrical former is configured to operate in a transmit (Tx) mode or in a receive (Rx) mode, the MRI RF coil array comprising: at least one row along cylindrical axis direction, where each row has more than three array coil elements to cover the whole circumference, where each coil element can work in Tx or Rx mode, where each coil is tuned to the working frequency in Rx mode, where each coil is tuned to another frequency in Tx mode, where another frequency is chosen in such a way that the desired mode frequency from the coupling among elements is at the working frequency.

A second example embodiment comprises the first embodiment, wherein the desired mode can be a birdcage-like uniform mode.

A third example embodiment comprises the first embodiment, wherein the desired mode can be a special low heat mode.

A fourth example embodiment comprises the first embodiment, wherein the cylindrical former is for head, knee, and leg anatomies.

The following examples are additional embodiments.

Example 1 is a single-layer magnetic resonance imaging (MRI) radio frequency (RF) coil array configured to operate in a transmit (Tx) mode or in a receive (Rx) mode, the MRI RF coil array comprising: at least one row of RF coil elements, wherein each row of the at least one row is arranged radially around a cylindrical axis, wherein each row comprises: at least four RF coil elements of that row circumferentially enclosing the cylindrical axis, wherein each RF coil element of the at least four RF coil elements of that row is configured to operate in a Tx mode and in a Rx mode, wherein, in the Rx mode, each RF coil element of the at least four RF coil elements of that row is tuned to a working frequency of the MRI RF coil array, wherein, in the Tx mode, each RF coil element of the at least four RF coil elements of that row is tuned to an additional frequency that is different than the working frequency, wherein the additional frequency is such that, for a selected mode resulting from coupling among the at least four RF coil elements of that row, a mode frequency of the selected mode is at the working frequency.

Example 2 comprises the subject matter of any variation of any of example(s) 1, wherein the selected mode is a birdcage-like uniform mode.

Example 3 comprises the subject matter of any variation of any of example(s) 1, wherein the selected mode is a special low heat mode.

Example 4 comprises the subject matter of any variation of any of example(s) 1-3, wherein the cylindrical axis is of a cylindrical former for at least one of a head anatomy, a knee anatomy, a leg anatomy, or a wrist anatomy.

Example 5 comprises the subject matter of any variation of any of example(s) 1-4, wherein, in the Tx mode, at least one RF coil element of the at least four RF coil elements of a first row of the at least one row is driven at the additional frequency via an electrical connection to a RF power supply.

Example 6 comprises the subject matter of any variation of any of example(s) 5, wherein, for each row, the at least four RF coil elements of that row are 4N RF coil elements, and wherein the at least one RF coil element of the at least four RF coil elements are two RF coil elements driven in quadrature.

Example 7 comprises the subject matter of any variation of any of example(s) 1-6, wherein, for each row, each RF coil element of the at least four RF coil elements of that row has partial overlaps with two neighboring RF coil elements of the at least four RF coil elements of that row, wherein the partial overlaps minimize coupling between that RF coil element and the two neighboring RF coil elements.

Example 8 comprises the subject matter of any variation of any of example(s) 1-7, wherein the at least one row comprises a first row and a second row different than the first row, wherein the first row is longitudinally offset from the second row along the cylindrical axis.

Example 9 comprises the subject matter of any variation of any of example(s) 8, wherein each RF coil element of the first row has at least one partial overlap with at least one associated RF coil element of the second row, wherein the at least one partial overlap minimizes coupling between that RF coil element and the at least one associated RF coil element of the second row.

Example 10 comprises the subject matter of any variation of any of example(s) 8, wherein, in the Tx mode, at least one RF coil element of the at least four RF coil elements of the first row and at least one RF coil element of the at least four RF coil elements of the second row are driven at the additional frequency via electrical connections to a power supply.

Example 11 is a single-layer magnetic resonance imaging (MRI) radio frequency (RF) coil array configured to operate in a transmit (Tx) mode or in a receive (Rx) mode, the MRI RF coil array comprising: at least four RF coil elements circumferentially enclosing a cylindrical axis, wherein each RF coil element of the at least four RF coil elements comprises: an LC coil of that RF coil element comprising at least one inductor of that RF coil element and at least one inductor of that RF coil element; a matching and transmit (Tx)/receive (Rx) switch circuit of that RF coil element; and a preamplifier of that RF coil element; wherein, when operating in the Rx mode, the matching and Tx/Rx switch circuit of that RF coil element tunes that RF coil element to a working frequency of the MRI RF coil array and electrically connects the LC coil of that RF coil element with the preamplifier of that RF coil element, wherein, when operating in the Tx mode, the matching and Tx/Rx switch circuit of that RF coil element tunes that RF coil element to an additional frequency that is different than the working frequency and electrically isolates the LC coil of that RF coil element from the preamplifier of that RF coil element, wherein the additional frequency is such that, for a selected mode resulting from coupling among the at least four RF coil elements, a mode frequency of the selected mode is at the working frequency, wherein, for each RF coil element of one or more RF coil elements of the at least four RF coil elements, when operating in the Tx mode, the matching and Tx/Rx switch circuit of that RF coil element electrically connects the LC coil of that RF coil element to a power source that drives that RF coil element at the additional frequency.

Example 12 comprises the subject matter of any variation of any of example(s) 11, wherein the selected mode is a birdcage-like uniform mode.

Example 13 comprises the subject matter of any variation of any of example(s) 11, wherein the selected mode is a special low heat mode.

Example 14 comprises the subject matter of any variation of any of example(s) 11-13, wherein the cylindrical axis is of a cylindrical former for at least one of a head anatomy, a knee anatomy, a leg anatomy, or a wrist anatomy.

Example 15 comprises the subject matter of any variation of any of example(s) 11-14, wherein the one or more RF coil elements of the at least four RF coil elements comprise two or more RF coil elements, wherein each RF coil element of the two or more RF coil elements is driven with a different phase.

Example 16 comprises the subject matter of any variation of any of example(s) 15, wherein the at least four RF coil elements are 4N RF coil elements, and wherein the two or more RF coil elements are two RF coil elements driven in quadrature.

Example 17 comprises the subject matter of any variation of any of example(s) 11-16, wherein each RF coil element of the at least four RF coil elements has partial overlaps with two neighboring RF coil elements of the at least four RF coil elements, wherein the partial overlaps minimize coupling between that RF coil element and the two neighboring RF coil elements.

Example 18 is a single-layer magnetic resonance imaging (MRI) radio frequency (RF) coil array configured to operate in a transmit (Tx) mode or in a receive (Rx) mode, the MRI RF coil array comprising: at least one row of RF coil elements, wherein each row of the at least one row is arranged radially around a cylindrical axis, wherein each row comprises: at least four RF coil elements of that row, wherein each RF coil element of the at least four RF coil elements of that row comprises: an LC coil of that RF coil element comprising at least one inductor of that RF coil element and at least one inductor of that RF coil element; a matching and transmit (Tx)/receive (Rx) switch circuit of that RF coil element; and a preamplifier of that RF coil element; wherein, when operating in the Rx mode, the matching and Tx/Rx switch circuit of that RF coil element tunes that RF coil element to a working frequency of the MRI RF coil array and electrically connects the LC coil of that RF coil element with the preamplifier of that RF coil element, wherein, when operating in the Tx mode, the matching and Tx/Rx switch circuit of that RF coil element tunes that RF coil element to an additional frequency that is different than the working frequency and electrically isolates the LC coil of that RF coil element from the preamplifier of that RF coil element, wherein the additional frequency is such that, for a selected mode resulting from coupling among the at least four RF coil elements of that row, a mode frequency of the selected mode is at the working frequency, wherein, for at least a first row of the at least one row, for each RF coil element of one or more RF coil elements the at least four RF coil elements of the at least the first row, when operating in the Tx mode, the matching and Tx/Rx switch circuit of that RF coil element electrically connects the LC coil of that RF coil element to a power source that drives that RF coil element at the additional frequency.

Example 19 comprises the subject matter of any variation of any of example(s) 18, wherein the selected mode is one of a birdcage-like uniform mode or a special low heat mode.

Example 20 comprises the subject matter of any variation of any of example(s) 18, wherein the cylindrical axis is of a cylindrical former for at least one of a head anatomy, a knee anatomy, a leg anatomy, or a wrist anatomy.

Example 21 is a MRI apparatus comprising a MRI RF coil array according to any variation of any of example(s) 1-20.

Circuits, apparatus, elements, MRI RF coils, arrays, methods, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the disclosure and appended claims. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "various embodiments," "one example", "an example", or "various examples" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrases "in one embodiment" or "in various embodiments" does not necessarily refer to the same embodiment(s), though it may.

"Circuit", as used herein, includes but is not limited to hardware, firmware, or combinations of each to perform a function(s) or an action(s), or to cause a function or action from another circuit, logic, method, or system. Circuit can include a software controlled microprocessor, a discrete logic (e.g., ASIC), an analog circuit, a digital circuit, a programmed logic device, a memory device containing instructions, and other physical devices. A circuit can include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

"Computer-readable storage device", as used herein, refers to a device that stores instructions or data. "Computer-readable storage device" does not refer to propagated signals. A computer-readable storage device can take forms, including, but not limited to, non-volatile media, and volatile media. Non-volatile media can include, for example, optical disks, magnetic disks, tapes, and other media. Volatile media can include, for example, semiconductor memories, dynamic memory, and other media. Common forms of a computer-readable storage device can include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store can store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature can be combined with one or more other features of the other implementations as may be desired and advantageous for any given or particular application.

What is claimed is:

1. A single-layer magnetic resonance imaging (MRI) radio frequency (RF) coil array configured to operate in a transmit (Tx) mode or in a receive (Rx) mode, the MRI RF coil array comprising:
at least one row of RF coil elements, wherein each row of the at least one row is arranged radially around a cylindrical axis, wherein each row comprises:
at least four RF coil elements of that row circumferentially enclosing the cylindrical axis, wherein each RF coil element of the at least four RF coil elements of that row is configured to operate in a Tx mode and in a Rx mode,
wherein, in the Rx mode, each RF coil element of the at least four RF coil elements of that row is tuned to a working frequency of the MRI RF coil array,
wherein, in the Tx mode, each RF coil element of the at least four RF coil elements of that row is tuned to an additional frequency that is different than the working frequency, wherein the additional frequency is such that, for a selected mode resulting from coupling among the at least four RF coil elements of that row, a mode frequency of the selected mode is at the working frequency.

2. The MRI RF coil array of claim 1, wherein the selected mode is a birdcage-like uniform mode.

3. The MRI RF coil array of claim 1, wherein the selected mode is a special low heat mode.

4. The MRI RF coil array of claim 1, wherein the cylindrical axis is of a cylindrical former for at least one of a head anatomy, a knee anatomy, a leg anatomy, or a wrist anatomy.

5. The MRI RF coil array of claim 1, wherein, in the Tx mode, at least one RF coil element of the at least four RF coil elements of a first row of the at least one row is driven at the additional frequency via an electrical connection to a RF power supply.

6. The MRI RF coil array of claim 5, wherein, for each row, the at least four RF coil elements of that row are 4N RF coil elements, and wherein the at least one RF coil element of the at least four RF coil elements are two RF coil elements driven in quadrature.

7. The MRI RF coil array of claim 1, wherein, for each row, each RF coil element of the at least four RF coil elements of that row has partial overlaps with two neighboring RF coil elements of the at least four RF coil elements of that row, wherein the partial overlaps minimize coupling between that RF coil element and the two neighboring RF coil elements.

8. The MRI RF coil array of claim 1, wherein the at least one row comprises a first row and a second row different than the first row, wherein the first row is longitudinally offset from the second row along the cylindrical axis.

9. The MRI RF coil array of claim 8, wherein each RF coil element of the first row has at least one partial overlap with at least one associated RF coil element of the second row, wherein the at least one partial overlap minimizes coupling between that RF coil element and the at least one associated RF coil element of the second row.

10. The MRI RF coil array of claim 8, wherein, in the Tx mode, at least one RF coil element of the at least four RF coil elements of the first row and at least one RF coil element of the at least four RF coil elements of the second row are driven at the additional frequency via electrical connections to a power supply.

11. A single-layer magnetic resonance imaging (MRI) radio frequency (RF) coil array configured to operate in a transmit (Tx) mode or in a receive (Rx) mode, the MRI RF coil array comprising:
at least four RF coil elements circumferentially enclosing a cylindrical axis, wherein each RF coil element of the at least four RF coil elements comprises:
an LC coil of that RF coil element comprising at least one inductor of that RF coil element and at least one capacitor of that RF coil element;
a matching and transmit (Tx)/receive (Rx) switch circuit of that RF coil element; and
a preamplifier of that RF coil element;
wherein, when operating in the Rx mode, the matching and Tx/Rx switch circuit of that RF coil element tunes that RF coil element to a working frequency of the MRI RF coil array and electrically connects the LC coil of that RF coil element with the preamplifier of that RF coil element,
wherein, when operating in the Tx mode, the matching and Tx/Rx switch circuit of that RF coil element tunes that RF coil element to an additional frequency that is different than the working frequency and electrically isolates the LC coil of that RF coil element from the preamplifier of that RF coil element, wherein the additional frequency is such that, for a selected mode resulting from coupling among the at least four RF coil elements, a mode frequency of the selected mode is at the working frequency,
wherein, for each RF coil element of one or more RF coil elements of the at least four RF coil elements, when operating in the Tx mode, the matching and Tx/Rx switch circuit of that RF coil element electrically connects the LC coil of that RF coil element to a power source that drives that RF coil element at the additional frequency.

12. The MRI RF coil array of claim 11, wherein the selected mode is a birdcage-like uniform mode.

13. The MRI RF coil array of claim 11, wherein the selected mode is a special low heat mode.

14. The MRI RF coil array of claim 11, wherein the cylindrical axis is of a cylindrical former for at least one of a head anatomy, a knee anatomy, a leg anatomy, or a wrist anatomy.

15. The MRI RF coil array of claim 11, wherein the one or more RF coil elements of the at least four RF coil elements comprise two or more RF coil elements, wherein each RF coil element of the two or more RF coil elements is driven with a different phase.

16. The MRI RF coil array of claim 15, wherein the at least four RF coil elements are 4N RF coil elements, and wherein the two or more RF coil elements are two RF coil elements driven in quadrature.

17. The MRI RF coil array of claim 11, wherein each RF coil element of the at least four RF coil elements has partial overlaps with two neighboring RF coil elements of the at least four RF coil elements, wherein the partial overlaps minimize coupling between that RF coil element and the two neighboring RF coil elements.

18. A single-layer magnetic resonance imaging (MRI) radio frequency (RF) coil array configured to operate in a transmit (Tx) mode or in a receive (Rx) mode, the MRI RF coil array comprising:
at least one row of RF coil elements, wherein each row of the at least one row is arranged radially around a cylindrical axis, wherein each row comprises:

at least four RF coil elements of that row, wherein each RF coil element of the at least four RF coil elements of that row comprises:

an LC coil of that RF coil element comprising at least one inductor of that RF coil element and at least one capacitor of that RF coil element;

a matching and transmit (Tx)/receive (Rx) switch circuit of that RF coil element; and a preamplifier of that RF coil element;

wherein, when operating in the Rx mode, the matching and Tx/Rx switch circuit of that RF coil element tunes that RF coil element to a working frequency of the MRI RF coil array and electrically connects the LC coil of that RF coil element with the preamplifier of that RF coil element, wherein, when operating in the Tx mode, the matching and Tx/Rx switch circuit of that RF coil element tunes that RF coil element to an additional frequency that is different than the working frequency and electrically isolates the LC coil of that RF coil element from the preamplifier of that RF coil element, wherein the additional frequency is such that, for a selected mode resulting from coupling among the at least four RF coil elements of that row, a mode frequency of the selected mode is at the working frequency, wherein, for at least a first row of the at least one row, for each RF coil element of one or more RF coil elements of the at least four RF coil elements of the at least the first row, when operating in the Tx mode, the matching and Tx/Rx switch circuit of that RF coil element electrically connects the LC coil of that RF coil element to a power source that drives that RF coil element at the additional frequency.

19. The MRI RF coil array of claim 18, wherein the selected mode is one of a birdcage-like uniform mode or a special low heat mode.

20. The MRI RF coil array of claim 18, wherein the cylindrical axis is of a cylindrical former for at least one of a head anatomy, a knee anatomy, a leg anatomy, or a wrist anatomy.

* * * * *